LEAD TELLURIDE - TIN TELLURIDE THERMOELECTRIC COMPOSITIONS AND DEVICES

Filed July 28, 1961

INVENTORS.
ERIC F. HOCKINGS &
WALTER L. MULARZ
BY W.S. Hill
AGENT 3,075,031

LEAD TELLURIDE-TIN TELLURIDE THERMOELECTRIC COMPOSITIONS AND DEVICES

Eric F. Hockings, Princeton, N.J., and Walter L. Mularz, Winchester, Mass., assignors to Radio Corporation of America, a corporation of Delaware Filed July 28, 1961, Ser. No. 127,660
7 Claims. (Cl. 136—5)

Figure 2:
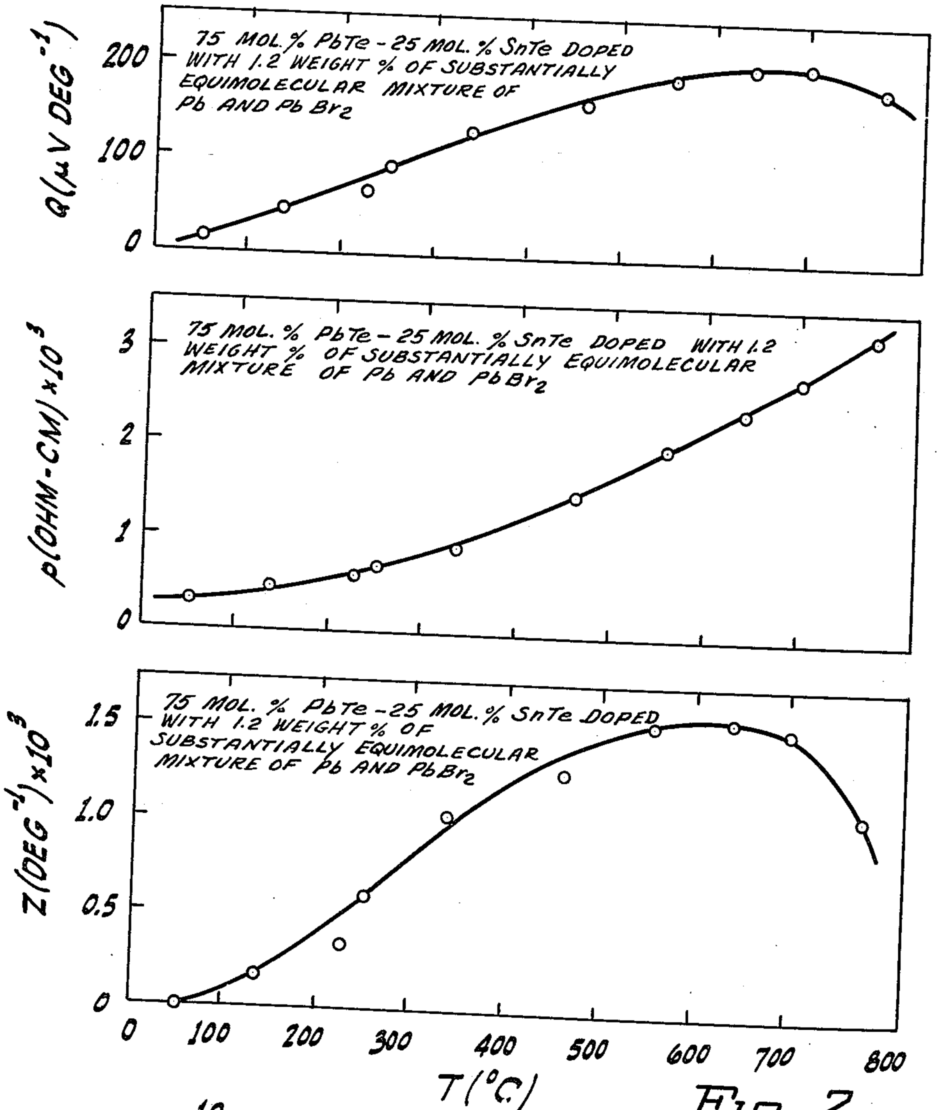

This invention relates to improved thermoelectric compositions and in particular to improved thermoelectric alloys of P-type conductivity, and improved thermoelectric devices made of these materials.

When two rods or wires of dissimilar thermoelectric compositions have their ends joined to form a continuous loop, two thermoelectric junctions are established between the respective ends so joined. If the two junctions are maintained at different temperatures, an electromotive force will be set up in the circuit thus formed. This effect is called the thermoelectric or Seebeck effect, and may be regarded as due to the charge carrier concentration gradient produced by a temperature gradient in the two materials. The effect cannot be ascribed to either material alone, since two dissimilar (thermoelectrically complementary) materials are necessary to obtain this effect. It is therefore customary to measure the Seebeck effect produced by a particular material by forming a thermocouple in which one circuit member or thermoelement consists of this material, and the other circuit member consists of a metal such as copper or lead, which has negligible thermoelectric power. The thermoelectric power (Q) of a material is the open circuit voltage developed by the above thermocouple when the two junctions are maintained at a temperature difference of 1° C.

The Seebeck effect is utilized in many practical applications, such as the thermocouple thermometer. The Seebeck effect is also important for the transformation of heat energy directly into electrical energy.

When thermal energy is converted to electrical energy by means of thermocouple devices utilizing the Seebeck effect, each device may be regarded as a heat engine operating between a heat source at a relatively hot temperature $T_H$ and a heat sink at a relatively cold temperature $T_C$. The limiting or maximum efficiency theoretically attainable from any heat engine is the Carnot efficiency, which is $$\frac{T_H - T_C}{T_H}$$

It is thus seen that the efficiency of Seebeck effect devices is increased by increasing the temperature difference $\Delta T$ between the hot junction temperature $T_H$ and the cold junction temperature $T_C$. Since it is convenient to operate such Seebeck devices with the cold junction at room temperature, it follows that high efficiency in the conversion of thermal energy to electrical energy requires that the hot junction temperature $T_H$ be as high as possible.

Some thermoelectric compositions such as bismuth telluride which are useful at relatively low temperatures cannot be operated at elevated temperatures because they tend to break down or react with the environment when heated to high temperatures. It is therefore necessary for high efficiency Seebeck devices to utilize only those thermoelectric compositions which are stable at elevated temperatures. Examples of such thermally stable thermoelectric compositions are lead telluride and silver antimony telluride. As noted above, the operation of a Seebeck device requires two thermoelectrically complementary circuit members or thermoelements, i.e., a P-type circuit member and an N-type circuit member. However, lead telluride and silver antimony telluride are naturally of P-type conductivity as made, and no satisfactory method for doping or converting materials to N-type conductivity has hitherto been found.

An object of this invention is to provide improved thermoelectric compositions having improved thermoelectric properties for application to power generation.

Another object is to provide improved thermoelectric compositions and alloys which may be readily and easily prepared to have high figures of merit.

Still another object of this invention is to provide improved thermoelectric devices capable of efficient operation for the direct conversion of heat into electric energy.

But another object is to provide improved N-type thermoelectric compositions capable of operating at temperatures up to 1000° K., and improved thermoelectric devices made of these compositions.

These and other objects of the invention are accomplished by providing thermoelectric compositions consisting essentially of an alloy of lead telluride PbTe and tin telluride SnTe. The preferred composition range for the alloy is from 95 to 70 mol percent lead telluride and from 5 to 30 mol percent tin telluride. According to the invention, these alloys are made N-type by the addition of a mixture of lead and lead bromide ($PbBr_2$). The preferred composition range for the mixture is 35 to 65 mol percent lead balance (65 to 35 mol percent) lead bromide ($PbBr_2$), and the amount of the mixture added to the PbTe-SnTe alloy is preferably in the range of 0.2 to 2.4 weight percent.

Throughout this application the weight percent of the lead-lead bromide doping mixture added is based on the total weight of the lead telluride-tin telluride alloy.

Figure 1:
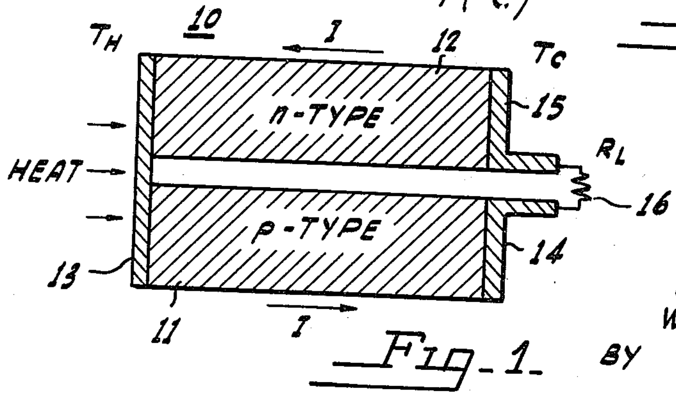

The invention will be described in greater detail by reference to the accompanying drawing, in which:

FIGURE 1 is a schematic cross-sectional view of a thermoelectric device according to the invention for the direct transformation of heat energy into electrical energy by means of the Seebeck effect; and, FIGURE 2 is a graph showing the variation of the thermoelectric properties with temperature in an N-type composition according to the invention consisting of 75 mol percent PbTe-25 mol percent SnTe doped with 1.2 weight percent of a substantially equimolecular mixture of lead and lead bromide.

Since good thermoelectric materials are near-degenerate semiconductors, they may be classed as N-type or P-type, depending on whether the majority carriers in the material are electrons or holes, respectively. The conductivity type of thermoelectric materials may be controlled by adding appropriate acceptor or donor impurity substances. Whether a particular material is N-type or P-type may be determined by noting the direction of current flow across a junction formed by a circuit member or thermoelement of the particular thermoelectric material and another thermoelement of complementary material when operated as a thermoelectric generator according to the Seebeck effect. The direction of the positive (conventional) current in the cold junction will be from the P-type toward the N-type thermoelectric material. The compositions according to this invention are of N-type conductivity.

There are three fundamental requirements for desirable thermoelectric materials. The first requirement is the development of a high electromotive force per degree difference in temperature between junctions in a circuit containing two thermoelectric junctions. This quality is referred to as the thermoelectric power (Q) of the material, and may be defined as $$\frac{d\theta}{dT}$$

where $d\theta$ is the potential difference induced by a temperature difference $dT$ between two ends of an element made of the material. The thermoelectric power of a material may also be considered as the energy relative to the Fermi level transmitted by a charge carrier along the material per degree temperature difference. The second requirement is a low thermal conductivity (K), since it would be difficult to maintain either high or low temperatures at a thermoelectric junction if one or both of the thermoelectric materials conducted heat too readily. High thermal conductivity in a thermoelectric material would reduce the efficiency of the resulting Seebeck or Peltier device. The third requisite for a good thermoelectric material is high electrical conductivity ($\sigma$), or, conversely stated, low, electrical resistivity ($\rho$). This requisite is apparent since the temperature difference between two junctions will be reduced if the current passing through the circuit generates excessive Joulean heat.

A quantitative approximation of the quality of a thermoelectric material may be made by relating the above three factors Q, K and $\rho$ in a Figure of Merit Z, which is usually defined as $$Z=\frac{Q^2}{\rho K}$$

if the properties of the two branches of the thermocouples are the same. Here Q is the thermoelectric power, $\rho$ is the electrical sensitivity, and K is the total thermal conductivity. Alternatively, the Figure of Merit Z may be defined as $$\frac{\sigma Q^2}{K}$$

where $\sigma$ is the electrical conductivity or reciprocal of $\rho$, and Q and K have the same meaning as above.

The validity of $$\frac{Q^2}{\rho K}$$

as a Figure of Merit for the indication of usefulness of thermoelectric materials for practical applications is well established. Thus, as an objective, high thermoelectric power, high electrical conductivity and low thermal conductivity are desired. These objectives are difficult to attain because materials which are good conductors of electricity are usually good conductors of heat, and the thermoelectric power and electrical resistivity of a material are not independent of each other. Accordingly, this objective becomes the provision of a material with maximum ratio of electrical to thermal conductivities and a high thermoelectric power.

A thermoelectric device, according to the invention, for the efficient conversion of thermal energy directly into electrical energy by means of the Seebeck effect is illustrated in FIGURE 1. The device 10 comprises two different thermoelectric circuit members or thermoelements of opposite conductivity type 11 and 12, which are conductively joined at one end, hereinafter denoted the hot junction end, by means of an intermediate member 13. The intermediate member 13 may be in the form of a bus bar or a plate, and is made of a material which is thermally and electrically conductive, and has negligible thermoelectric power. Metals and alloys are suitable materials for this purpose. In this example, intermediate member 13 consists of a copper plate. The circuit members or thermoelements 11 and 12 terminate at the end opposite the hot thermoelectric junction in electrical contacts 14 and 15, respectively. In this example, contacts 14 and 15 are copper plates.

*Example I*

As indicated above, it has been found that improved efficiency in the direct conversion of thermal energy into electrical energy is obtained in Seebeck thermocouple devices of the type shown in FIGURE 1 by preparing at least one of the two thermoelectric circuit members or thermoelements 11 and 12 from a material composed of lead telluride and tin telluride, the composition being doped with a sufficient amount of a mixture of lead and lead bromide to be of N-type conductivity. In this example, circuit member 12 is made of an N-type thermoelectric material having a composition within the above range. The specific composition of this example consists of 85 mol percent lead telluride-15 mol percent tin telluride with 1.2 weight percent of a substantially equimolecular mixture of lead and lead bromide. The other circuit member 11 is made of thermoelectrically complementary material, that is, of opposite conductivity type material, which is P-type material in this example. Suitable P-type materials for this purpose are lead telluride and silver antimony telluride.

In the operation of the device 10, the metal plate 13 is heated to a temperature $T_H$ and becomes the hot junction of the device. The metal contacts 14 and 15 on thermoelements 11 and 12 respectively are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15, respectively. The electromotive force developed under these conditions produces in the external circuit a flow of (conventional) current (I) in the direction shown by arrows in FIGURE 1, that is, from the P-type thermoelement 11 toward the N-type thermoelement 12 in the external circuit. The device is utilized by connecting a load, shown as a resistance 16 in the drawing, between the contacts 14 and 15 of thermoelements 11 and 12, respectively.

A series of compositions according to the invention are easily prepared by melting together the desired ratios of lead telluride and tin telluride, along with the proper amounts of lead and lead bromide. The ingredients may be melted together in a sealed Vycor tube, or in a fused quartz ampule. Alternatively, the correct proportions of elemental lead, tin, and tellurium may be melted together with the lead-lead bromide doping agent to form the N-type compositions of the invention. For example, the powdered or granulated ingredients may be heated together to a temperature of about 1000° C., and held at this temperature for about one hour in a furnace which is slowly rocked to obtain uniform mixing of the melt. The melt is permitted to cool slowly in the furnace by a Bridgman temperature-gradient technique. The resulting ingot may be zone-levelled by passing a molten zone along the ingot first in one direction and then in the opposite direction. The tube or ampule is removed from the furnace, and then opened to obtain the solidified ingot.

The N-type composition of this example may be prepared as described above by melting together in an ampoule 10.83 grams lead, 1.097 grams tin, 7.875 grams tellurium, and a doping agent mixture consisting of .119 gram lead and .19 gram lead bromide. This composition corresponds to 85 mol percent PbTe, 15 mol percent SnTe, and 1.2 weight percent of a mixture consisting of 64 mol percent Pb and 36 mol percent $BbBr_2$. The thermoelectric power (Q) of this composition is −44 microvolts per degree C.; the electrical resistivity $\rho$ is $1.8\times10^{-4}$ ohm-cm.; and the thermal conductivity (K) is .036 watt per cm. per degree C. The Figure of Merit (Z) for this composition, that is, the value of $$\frac{Q^2}{\rho K}$$

is about $3\times10^{-5}$ deg. $^{-1}$ at room temperature.

*Example II*

In this example, the circuit member 12 of the thermoelectric Seebeck device 10 is prepared from a material composed of 80 mol percent lead telluride and 20 mol percent tin telluride. This material is made N-type by the addition of a sufficient amount of a mixture of lead and lead bromide. The specific composition of this embodiment may be prepared as described above by melting together in an ampule 7.988 grams lead, 1.143 grams tin, 6.157 grams tellurium, and a doping agent mixture consisting of .152 gram lead and .155 gram lead bromide. This composition corresponds to 80 mol percent lead telluride, 20 mol percent tin telluride, and 2 weight percent of a mixture consisting of 63 mol percent lead and 37 mol percent lead bromide. The thermoelectric power (Q) of this composition is −37 microvolts per degree C.; the electrical resistivity ($\rho$) is $1.8\times10^{-4}$ ohm-cm.; and the thermal conductivity (K) is .041 watt per cm. per degree C. The Figure of Merit (Z) for this composition, that is, the value of $$\frac{Q^2}{\rho K}$$

is about $1.8\times10^{-4}$ deg. $^{-1}$ at room temperature.

*Example III*

In this example, the circuit member 12 of the thermoelectric device 10 is prepared from a material composed of 75 mol percent lead telluride and 25 mol percent tin telluride. This material is made N-type by the addition of a mixture of lead and lead bromide. The composition of this example may be prepared as described above by melting together in an ampule 9.83 grams lead, 1.88 grams tin, 8.08 grams tellurium, and a doping agent mixture consisting of .119 grams lead and .119 grams lead bromide. This composition corresponds to 75 mol percent lead telluride, 25 mol percent tin telluride, and 1.2 weight percent of a mixture consisting of 64 mol percent lead and 36 mol percent lead bromide. The thermoelectric power (Q) of this composition is −50 microvolts per degree C.; the electrical resistivity ($\rho$) is $2.4\times10^{-4}$ ohm-cm.; and the thermal conductivity (K) is .034 watt per cm. per degree C. The Figure of Merit (Z) for this composition, that is, the value of $$\frac{Q^2}{\rho K}$$

is about $3\times10^{-4}$ deg. $^{-1}$ at room temperature. As indicated in FIGURE 2, a thermoelectric material of this composition has a Figure of Merit Z of at least $1\times10^{-3}$ deg.$^{-1}$ or above over the temperature range from 350° C. to 750° C., and is useful for Seebeck devices in which the thermoelement of this material is operated within this temperature range. For comparison, the Figure of Merit Z for an N-type material of the prior art, such as an alloy of 75 mol. percent $Bi_2Te_3$-25 mol percent $Bi_2Se_3$, falls below $1\times10^{-3}$ deg.$^{-1}$ for temperatures above 350° C., and hence is less efficient than the composition of this example for Seebeck devices operated with the hot junction at temperatures above 350° C.

*Example IV*

In this example, the circuit member or thermoelement 12 of the Seebeck device 10 is prepared from a material composed of 70 mol percent lead telluride and 30 mol percent tin telluride. This material is made N-type by the addition of a mixture of lead and lead bromide. The composition of this example may be prepared as described above by melting together in an ampoule 10.7291 grams of lead, 2.6315 grams of tin, 9.4515 grams of tellurium, and a mixture consisting of 0.1337 grams lead and 0.2396 gram lead bromide. This composition corresponds to 70 mol percent lead telluride-30 mol percent tin telluride with 1.63 weight percent of a mixture consisting of 49.7 mol percent lead and 50.3 mol percent lead bromide. The thermoelectric power (Q) of this composition is −8.2 microvolts per degree C.; the electrical resistivity ($\rho$) is $2.54\times10^{-4}$ ohm-cm.; and the thermal conductivity (K) is 0.0325 watt per cm. per degree C. The Figure of Merit Z for this composition, that is, the value of $$\frac{Q^2}{\rho K}$$

is about $8\times10^{-6}$ deg. $^{-1}$ at room temperature.

*Example V*

In this example, one thermoelement 12 of the thermoelectric Seebeck device 10 is prepared from a material composed of 95 mol percent lead telluride and 5 mol percent tin telluride. This material is made N-type by the addition of a mixture of lead and lead bromide. The composition of this example may be prepared as described above by melting together in an ampoule 8.2909 grams of lead, 0.2507 grams of tin, 5.3904 grams of tellurium, and as the doping agent a mixture consisting of 0.0559 grams of lead and 0.0991 grams of lead bromide. This composition corresponds to 95 mol percent lead telluride, 5 mol percent tin telluride doped with 1.1 weight percent of a mixture consisting of 50 mol percent lead and 50 mol percent lead bromide. The thermoelectric power (Q) of this composition is −23 microvolts per degree C.; the electrical resistivity ($\rho$) is $1.3\times10^{-4}$ ohm-cm.; and the thermal conductivity (K) is 0.054 watt per cm. per degree C. The Figure of Merit Z for this composition is about $7.5\times10^{-5}$ deg.$^{-1}$ at room temperature.

There have thus been described improved thermoelectric materials of novel composition which possess advantageous thermoelectric properties and which are easily prepared. Thermoelements and thermoelectric devices made of these materials are useful in various applications, such as the direct conversion of heat into electricity.

What is claimed is:

1. An N-type thermoelectric alloy consisting essentially of 95 to 70 mol percent lead telluride and 5 to 30 mol percent tin telluride, said alloy containing 0.2 to 2.4 weight percent of a mixture of lead and lead bromide, said weight percent being a percent of the weight of said lead telluride and tin telluride, said mixture consisting of 35 to 65 mol percent lead, balance lead bromide.

2. An N-type thermoelectric alloy consisting essentially of 75 mol percent lead telluride-25 mol percent tin telluride, said alloy containing 0.2 to 2.4 weight percent of a mixture of lead and lead bromide, said weight percent being a percent of the weight of said lead telluride and tin telluride, said mixture consisting of 35 to 65 mol percent lead, balance lead bromide.

3. An N-type thermoelectric alloy consisting essentially of 75 mol percent lead telluride-25 mol percent tin telluride, said alloy containing 1.2 weight percent of a mixture of lead and lead bromide, said weight percent being a percent of the weight of said lead telluride and tin telluride, said mixture consisting of 35 to 65 mol percent lead, balance lead bromide.

4. A thermoelement for use in a thermoelectric device, said thermoelement comprising an N-type alloy consisting essentially of 95 to 70 mol percent lead telluride and 5 to 30 mol percent tin telluride, said alloy containing 0.2 to 2.4 weight percent of a mixture of lead and lead bromide, said weight percent being a percent of the weight of said lead telluride and tin telluride, said mixture consisting of 35 to 65 mol percent lead, balance lead bromide.

5. A thermoelement for use in a thermoelectric device, said thermoelement comprising an N-type alloy of 75 mol percent lead telluride-25 mol percent tin telluride with 1.2 weight percent of a mixture of lead and lead bromide, said weight percent being a percent of the weight of said lead telluride and tin telluride, said mixture consisting of 35 to 65 mol percent lead, balance lead bromide.

6. A thermoelectric device comprising two thermoelements of thermoelectrically complementary material, said thermoelements being conductively joined to form a thermoelectric junction, one of said two thermoelements comprising an N-type thermoelectric alloy consisting of 95 to 70 mol percent lead telluride and 5 to 30 mol percent tin telluride, said alloy containing 0.2 to 2.4 weight percent of a mixture of lead and lead bromide, said weight percent being a percent of the weight of said lead telluride and tin telluride, said mixture consisting of 35 to 65 mol percent lead, balance lead bromide.

7. A thermoelectric device comprising two thermoelements of thermoelectrically complementary material, said thermoelements being conductively joined to form a thermoelectric junction, one of said two thermoelements comprising an N-type thermoelectric alloy consisting of 75 mol percent lead telluride-25 mol percent tin telluride with 1.2 weight percent of a mixture of lead and lead bromide, said weight percent being a percent of the weight of said lead telluride and tin telluride, said mixture consisting of 35 to 65 mol percent lead, balance lead bromide.

References Cited in the file of this patent

UNITED STATES PATENTS 2,811,440 Fritts et al. ____________ Oct. 29, 1957

OTHER REFERENCES

Hashimotto et al.: Journal Phys. Soc., Japan, volume 11, 1956, pages 716–717.

UNITED STATES PATENT OFFICE
CERTIFICATE OF CORRECTION

Patent No. 3,075,031 January 22, 1963

Eric F. Hockings et al.

It is hereby certified that error appears in the above numbered patent requiring correction and that the said Letters Patent should read as corrected below.

Column 4, line 58, for ".19" read -- .119 --; line 61, for "$BbBr_2$" read -- $PbBr_2$ --.

Signed and sealed this 27th day of August 1963.

SEAL)
ttest:

ERNEST W. SWIDER
ttesting Officer

DAVID L. LADD
Commissioner of Patents